(12) United States Patent
Treiber et al.

(10) Patent No.: US 10,734,480 B2
(45) Date of Patent: Aug. 4, 2020

(54) SEMICONDUCTOR DEVICE HAVING A TRANSISTOR AND A CONDUCTIVE PLATE

(71) Applicant: Infineon Technologies Austria AG, Villach (AT)

(72) Inventors: Maximilian Treiber, Munich (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/869,737

(22) Filed: Jan. 12, 2018

(65) Prior Publication Data
US 2018/0204914 A1 Jul. 19, 2018

(30) Foreign Application Priority Data

Jan. 13, 2017 (DE) .................. 10 2017 100 614

(51) Int. Cl.
| | |
|---|---|
| *H01L 21/00* | (2006.01) |
| *H01L 29/10* | (2006.01) |
| *H01L 29/40* | (2006.01) |
| *H01L 29/78* | (2006.01) |
| *H01L 23/58* | (2006.01) |
| *H01L 29/417* | (2006.01) |
| *H01L 29/423* | (2006.01) |
| *H01L 29/06* | (2006.01) |
| *H01L 21/8234* | (2006.01) |

(52) U.S. Cl.
CPC ........ *H01L 29/1087* (2013.01); *H01L 23/585* (2013.01); *H01L 29/407* (2013.01); *H01L 29/41775* (2013.01); *H01L 29/4232* (2013.01); *H01L 29/7802* (2013.01); *H01L 29/7803* (2013.01); *H01L 21/823462* (2013.01); *H01L 29/0634* (2013.01); *H01L 29/41766* (2013.01)

(58) Field of Classification Search
CPC ............... H01L 29/1087; H01L 29/407; H01L 29/7803
See application file for complete search history.

(56) References Cited

U.S. PATENT DOCUMENTS

| | | | | |
|---|---|---|---|---|
| 8,034,685 | B1 * | 10/2011 | Venkatraman | ........ H01L 29/407 438/270 |
| 9,620,583 | B2 * | 4/2017 | Kelkar | ................ H01L 29/0623 |

(Continued)

FOREIGN PATENT DOCUMENTS

DE    102017100614 A1 *  7/2018   ......... H01L 29/1087

*Primary Examiner* — Laura M Menz
(74) *Attorney, Agent, or Firm* — Murphy, Bilak & Homiller, PLLC (57) ABSTRACT

A semiconductor device includes a transistor. The transistor includes a source region adjacent to a first main surface of a semiconductor substrate, the source region being electrically coupled to a source terminal via a source contact. The transistor further includes a gate electrode over the first main surface of the semiconductor substrate, a drain region adjacent to a second main surface of the semiconductor substrate, and a conductive plate vertically adjacent to the gate electrode. The conductive plate is in electrical contact with the source terminal. The transistor further includes an insulating material arranged between the conductive plate and the source contact in a direction parallel to the first main surface.

12 Claims, 10 Drawing Sheets

(56) References Cited

U.S. PATENT DOCUMENTS

| | | | |
|---|---|---|---|
| 2005/0285189 A1* | 12/2005 | Shibib | H01L 29/402 257/341 |
| 2010/0163979 A1 | 7/2010 | Hebert | |
| 2010/0169379 A1* | 7/2010 | O'Sullivan | G06F 16/10 707/791 |
| 2013/0193502 A1* | 8/2013 | Kocon | H01L 29/1095 257/302 |
| 2015/0115355 A1* | 4/2015 | Hider | H01L 29/7813 257/331 |
| 2016/0380089 A1* | 12/2016 | Bahl | H01L 24/97 257/192 |
| 2018/0204914 A1* | 7/2018 | Treiber | H01L 29/7802 |

\* cited by examiner

SEMICONDUCTOR DEVICE HAVING A TRANSISTOR AND A CONDUCTIVE PLATE

BACKGROUND

Power transistors commonly employed in automotive, industrial and consumer electronics require a low on-state resistance ($R_{on}$) while securing a high voltage blocking capability. For example, a MOS ("metal oxide semiconductor") power transistor should be capable, depending upon application requirements to block drain to source voltages $V_{ds}$ of some tens to some hundreds or thousands Volts. MOS power transistors typically conduct very large currents which may be up to some hundreds of Amperes at typical gate-source voltages of about 2 to 20 V.

Voltage converters e.g. convert a voltage from the common alternating voltage mains network to a direct voltage required for operating an electronic device at a low voltage e.g. in a range of 12 V down to below 1 V. Voltage converters commonly employ MOSFETs ("metal oxide semiconductor field effect transistor").

According to concepts of a vertical MOSFET having a planar gate electrode, a source region is disposed adjacent to a first main surface of a semiconductor substrate and a drain region may be disposed adjacent to a second main surface of the semiconductor substrate. A gate electrode is disposed adjacent to the first main surface and over the first main surface.

Ringing effects refer to oscillations of gate and drain voltages. With the miniaturization of power MOSFETs, ringing effects may become more severe. Hence, attempts are being made to develop power MOSFETs causing reduced ringing effects.

It is desirable to provide an improved semiconductor device.

SUMMARY

According to one or more embodiments, there is provided the claimed matter according to the independent claims. Further developments are defined in the dependent claims.

A semiconductor device comprises a transistor. The transistor comprises a source region adjacent to a first main surface of a semiconductor substrate, the source region being electrically coupled to a source terminal via a source contact. The transistor further comprises a gate electrode over the first main surface of the semiconductor substrate, a drain region adjacent to a second main surface of the semiconductor substrate, and a conductive plate vertically adjacent to the gate electrode. The conductive plate is in electrical contact with the source terminal. The transistor further comprises an insulating material arranged between the conductive plate and the source contact in a direction parallel to the first main surface.

According to further embodiments, a semiconductor device comprises a transistor. The transistor comprises a source region adjacent to a first main surface of a semiconductor substrate, the source region being electrically coupled to a source terminal. The transistor further comprises a gate electrode over the first main surface of the semiconductor substrate, a drain region adjacent to a second main surface of the semiconductor substrate, and a conductive plate over the gate electrode, the conductive plate being in electrical contact with the source terminal. The transistor further comprises a gate dielectric layer having a thickness t between the gate electrode and the semiconductor substrate. A distance d between the conductive plate and the gate electrode fulfills the following formula: $d \leq 10 \times t$.

According to further embodiments, a semiconductor device comprises a transistor. The transistor comprises a source region adjacent to a first main surface of a semiconductor substrate, the source region being electrically coupled to a source terminal, a gate electrode over a first main surface of the semiconductor substrate, and a drain region adjacent to a second main surface of the semiconductor substrate. The transistor further comprises a conductive plate horizontally spaced apart from the gate electrode. An effective resistance $R_{P1}$ of the conductive plate is larger than an effective resistance $R_G$ of the gate electrode.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

DETAILED DESCRIPTION

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The term "over a main surface", in particular with reference to the main surface of a volume element such as a substrate or a semiconductor body is intended to mean that the respective element is arranged outside the volume element. Further, the term "over" a volume element such as a substrate or a semiconductor body is intended to mean that the respective element is arranged outside the volume element.

The description of the embodiments is not limiting. In particular, elements of the embodiments described may be combined with elements of different embodiments.

The terms "wafer", "substrate" or "semiconductor substrate" used in the following description may comprise any semiconductor-based structure that has a semiconductor surface. Wafer and structure are to be understood to comprise silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

As used, the terms "having", "containing", "including", "comprising" and the like are open ended terms that indicate the presence of stated elements or features, but do not preclude additional elements or features. The articles "a", "an" and "the" are intended to comprise the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The Figures and the description illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

Throughout the present specification elements of transistor cells of a field effect transistor are described. Generally, the field effect transistor comprises a plurality of transistor cells that are connected in parallel. For example, each single transistor cell comprises a single gate electrode, a body region and further components. The gate electrodes of the single transistor cells may be connected to a common terminal, e.g. the gate terminal. Further components of the single transistor cells, e.g. the source regions, the drain regions may be respectively connected to a common source terminal, a common drain terminal, etc.

Figure 1A:
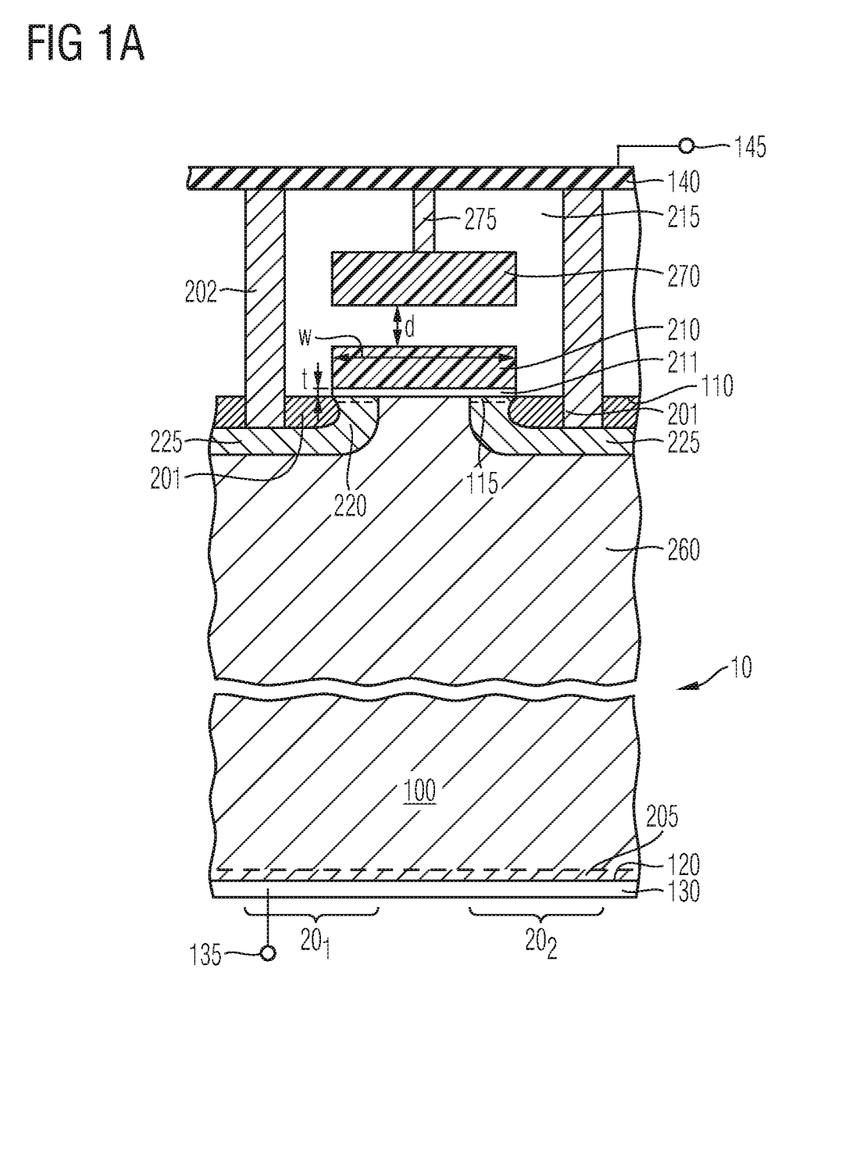
FIG. 1A shows a vertical cross-sectional view of a semiconductor device according to one or more embodiments.

FIG. 1A shows a vertical cross-sectional view of a semiconductor device according to an example. The semiconductor device 10 shown in FIG. 1A is formed in a semiconductor substrate 100 having a first main surface 110 and a second main surface 120. A source region 201 is arranged adjacent to the first main surface 110 of the semiconductor substrate. The source region 201 is electrically coupled to a source terminal 145 via a source contact 202. The semiconductor device further comprises a gate electrode 210 disposed over the first main surface 110 of the semiconductor substrate. The semiconductor device further comprises a drain region 205 adjacent to the second main surface 120 of the semiconductor substrate. The semiconductor device 10 further comprises a conductive plate 270 which is arranged vertically adjacent to the gate electrode 210. The conductive plate 270 is electrically connected to the source terminal 145. The semiconductor device further comprises an insulating material 215 arranged between the conductive plate 270 and the source contact 202 in a direction parallel to the first main surface 110.

The semiconductor device shown in FIG. 1A implements a vertical transistor having a planar gate electrode. The gate electrode 210 is disposed adjacent to the first main surface 110 and is electrically insulated from the semiconductor substrate by means of a gate dielectric layer 211. The source region 201 may be of the first conductivity type, e.g. n-type. A body region 220 of the second conductivity type, e.g. p-type may be disposed adjacent to the source region 201 and adjacent to the first main surface 110. The source region 201 and the body region 220 are embedded in a drift zone 260 of the first conductivity type. The drain region may e.g. be of the first conductivity type, e.g. n-type. When a suitable voltage is applied to the gate electrode 210, an inversion layer 115 (conductive channel) is formed adjacent to the interface between the semiconductor substrate 100 and the gate dielectric layer 211. Accordingly, the transistor is in a conducting state between the source region 201 and the drain region 205 via the body region 220 and the drift zone 260.

The source region 201 is connected via a source contact 202 to a source conductive layer 140. The source conductive layer 140 may e.g. be implemented by a metallization layer, e.g. tungsten, copper, aluminum-silicon-copper alloys. The source conductive layer 140 may electrically connect source regions 201 of a plurality of transistor cells of a semiconductor device to a source terminal 145. The source conductive layer 140 may be arranged over the first main surface 110 of the semiconductor substrate. The source conductive layer 140 is electrically coupled to the source terminal 145.

A portion 225 of the body region 220 may be electrically coupled via the source contact 202 to the source conductive layer 140 and to the source terminal 145. Due to this contact, a parasitic bipolar transistor may be avoided or deteriorated which might otherwise be formed. A drain conductive or metallization layer 130 may be arranged adjacent to the second main surface 120 of the semiconductor substrate. For example, the drain metallization layer may be electrically coupled to a drain terminal 135. The drain region 205 may be electrically connected to the drain terminal 135 via the drain metallization layer 130.

The semiconductor device shown in FIG. 1A further comprises the conductive plate 270 which is electrically connected to the source terminal 145. For example, the conductive plate 270 may be electrically connected to the source conductive layer 140 via a contact portion 275.

The conductive plate 270 is arranged vertically adjacent to the gate electrode. In the context of the present disclosure, this term is intended to mean that there is a region in which the conductive plate 270 is arranged in close spatial relationship and at a small distance from the gate electrode 210 in a vertical direction. For example, the conductive plate 270 may be arranged over the gate electrode 210. In this context, the term "arranged over the gate electrode" means that the conductive plate 270 is arranged on a side of the gate electrode remote from the semiconductor substrate 100. According to another example, the conductive plate 270 may be arranged on a side of the gate electrode 210 facing the semiconductor substrate 100, as will be explained below with reference to FIG. 1B. For example, the conductive plate 270 may be arranged between the gate electrode 210 and the semiconductor substrate 100. An insulating material 215 may be disposed between the conductive plate 270 and the gate electrode 210.

Moreover, the term "vertically adjacent" means that the conductive plate 270 overlaps in a horizontal direction with the gate electrode 210. In this context, the term "overlap" means that e.g. a projection of a portion of the conductive plate 270 in a certain direction coincides with a portion of the gate electrode 210 and vice versa. Further, the conductive plate 270 and the gate electrode 210 may be arranged at a distance. For example, the term "overlap in a horizontal direction" may mean that a projection of a portion of the conductive plate 270 in a vertical direction coincides with a portion of the gate electrode and vice versa.

For example, the conductive plate may fully overlap with the gate electrode in a horizontal direction. In this case, a projection of the entire conductive plate 270 in the vertical direction coincides with the gate electrode, or a projection of the entire gate electrode 210 in the vertical direction coincides with the conductive plate 270. According to further examples, the lateral extension, i.e. a length and a width along a horizontal direction of the conductive plate 270 may not be larger or smaller than a width and a length of the gate electrode.

According to further examples, the conductive plate 270 partially overlaps with the gate electrode in a horizontal direction. This means that at least a portion of the conductive plate 270 overlaps in a horizontal direction with the gate electrode 210.

According to a different interpretation, an additional gate-source capacitance is introduced by providing the conductive plate that is electrically connected to the source terminal 145. This additional gate-source capacitance may be implemented due to an overlap, for example, a horizontal or vertical overlap of the conductive plate 270 and the gate electrode 210.

An insulating material 215 is arranged between the conductive plate 270 and the gate electrode 210. For example, a thickness d of the insulating material 215 and a thickness t of the gate dielectric layer 211 may fulfill the following formula:

$$d \leq 10 \times t \text{ or } d \leq 5 \times t \quad (1)$$

Further, following formula may be fulfilled:

$$t \leq d \quad (2)$$

If the distance d is larger than the upper value, the source-gate capacitance will be reduced resulting in an insufficient effect of the additional source-gate capacitance. If the distance d is below the lower boundary, a source-gate breakdown may occur at the thinnest portion of the insulating layer 215, which may result in a worse maximum gate-source voltage (Vgs,max) rating of the semiconductor device (corresponding to the rating of the semiconductor device in terms of a maximum gate-source voltage the semiconductor device may withstand).

The conductive plate 270 may be distinct from the source conductive layer 140. For example, a material of the conductive plate may be different from a material of the source conductive layer 140. According to an example, the conductive plate 270 may be made of polysilicon or of a metal having a high electrical conductivity. By way of example, any metal or copper, tungsten or aluminum-silicon copper alloys may be used as a material of the conductive plate 270. According to an example, the conductive plate 270 may be made of the material of the source conductive layer 140. Further, a lateral extension of the conductive plate 270, e.g. a length and a width measured in a horizontal direction may be less than a lateral extension of the source conductive layer 140. According to a further example, the conductive plate 270 may be electrically connected to the source conductive layer 140 via a contact portion 275. For example, in such a case, the source conductive layer 140 has a larger distance to the gate electrode 210 than the conductive plate 270.

As has been mentioned above, a conductive channel 115 may be formed in a lateral direction, e.g. adjacent to the first main surface 110 of the semiconductor substrate 100. A current flow of the entire transistor is accomplished in a vertical direction, e.g. between the source region 201 and drain region 205 disposed at the first and second main surfaces, respectively.

According to the configurations described, two adjacent transistor cells 20₁ and 20₂ are disposed laterally adjacent to each other. The two transistor cells 20₁ and 20₂ may share a common gate electrode 210 and a common conductive plate 270. As is clearly to be understood, the conductive plate 270 may also be split so that any of the adjacent transistor cells comprises a separate conductive plate 270. Source contacts 202 electrically connect the source regions 201 of the single transistor cells to the source conductive layer 140.

As shown, one conductive plate 270 may be assigned to two adjacent transistor cells. The conductive plate 270 may have a width w that is smaller than a lateral distance between adjacent source contacts. In this respect, the width w and the lateral distance are measured in a horizontal direction, in particular, parallel to a first main surface of the semiconductor substrate. An insulating material 215 may be arranged between the conductive plate 270 and the source contact 202 in a direction parallel to the first main surface 110. In particular, the insulating material 215 may separate the conductive plate 270 and the source contact 202. Examples of the insulating material 215 comprise silicon oxide, borosilicate glass (BSG), phosphosilicate glass (PSG) or borophosphosilicate glass (BPSG) and other dielectric materials.

Figure 1B:
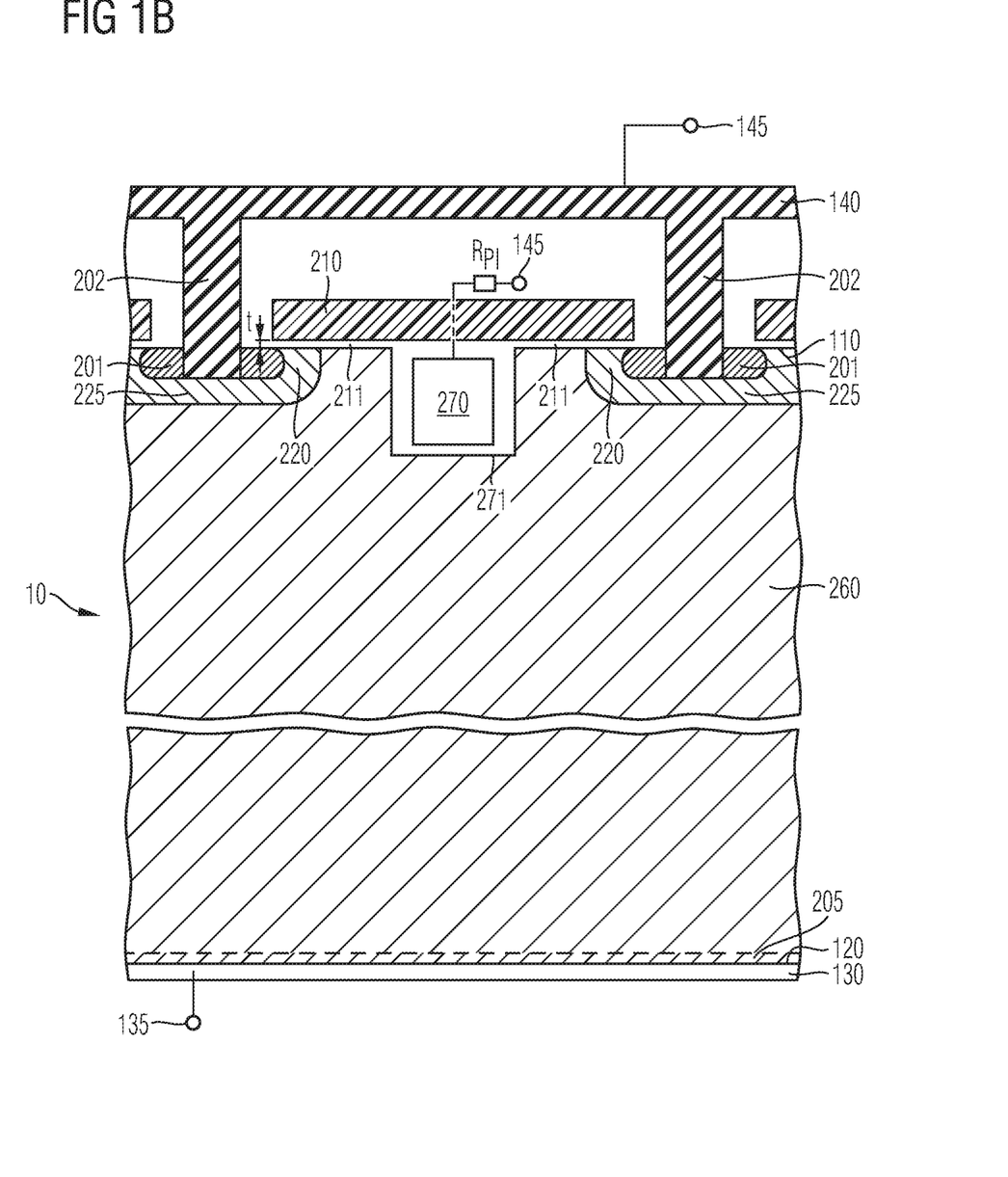
FIG. 1B shows a vertical cross-sectional view of a semiconductor device according to one or more further embodiments.

FIG. 1B shows a further example of a semiconductor device 10. The example of FIG. 1B is similar to the example of FIG. 1A. Differing from the example shown in FIG. 1A, the conductive plate 270 is disposed below the gate electrode 210. In the context of the present specification, the term "the conductive plate 270 is disposed below the gate electrode" is intended to mean that the conductive plate 270 is disposed on a side of the gate electrode 210, the side facing the semiconductor substrate 100. For example, the conductive plate 270 may be arranged in a trench 271. The trench 271 may be formed in a first main surface 110 of the semiconductor substrate. The conductive plate 270 may be electrically connected to a source terminal 145. For example, an electrical contact connecting the conductive plate 270 to the source terminal 145 may be arranged before or behind the depicted plane of the drawing. For example, an effective resistance $R_{P1}$ of the conductive plate 270 may have a certain value, as will be explained below. As is to be further understood, a portion of the conductive plate 270 may extend over the first main surface 110 of the semiconductor substrate 100, as is, for example, indicated in FIG. 2B.

For example, the conductive plate 270 may extend to a depth of 100 nm to several μm in the semiconductor substrate 100. The buried conductive plate may cause a shielding, e.g. an electrostatic shielding of the gate electrode. As a result, as an additional effect, the gate-drain capacitance of the transistor may be reduced.

Figure 1C:
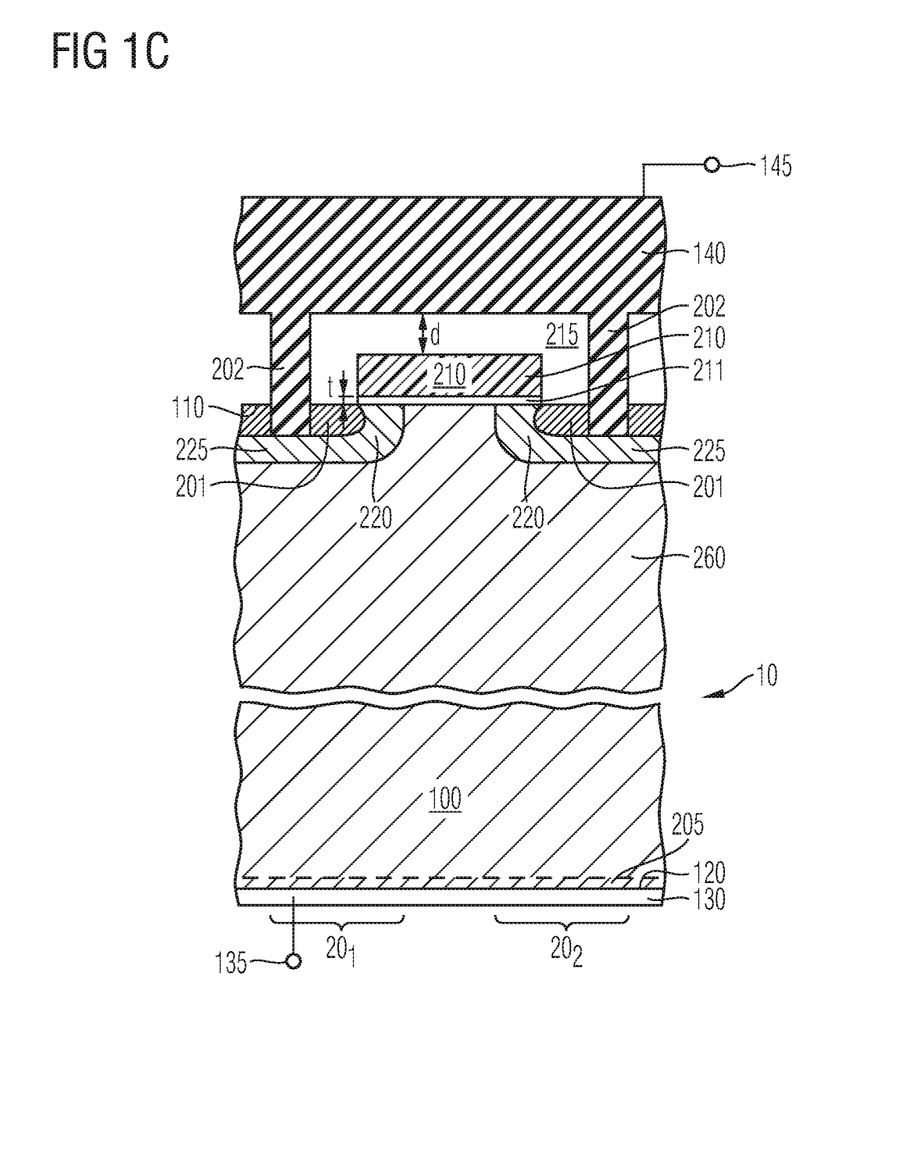
FIG. 1C shows a vertical cross-sectional view of a semiconductor device according to one or more further embodiments.

FIG. 1C shows a further example illustrating an semiconductor device 10. The example of FIG. 1C is similar to the example of FIG. 1A. Differing from the example shown in FIG. 1A, the conductive plate 270 is formed integrally with the source conductive layer 140. In more detail, the source conductive layer 140 is arranged so that a distance d between the gate electrode 210 and the source conductive layer 140 and the thickness t of the gate dielectric layer 211 fulfil the following formulas:

$$t \leq d \quad (3)$$

$$d \leq 10 \times t \text{ or } d \leq 5 \times t \quad (4)$$

If the distance d is larger than the upper value, the source-gate capacitance will be reduced resulting in an insufficient effect of the additional source-gate capacitance. If the distance d is below the lower boundary, a source-gate breakdown may occur at the thinnest portion of the insulating layer 215, which may result in a worse maximum gate-source voltage (Vgs,max) rating of the semiconductor device.

Figure 1D:
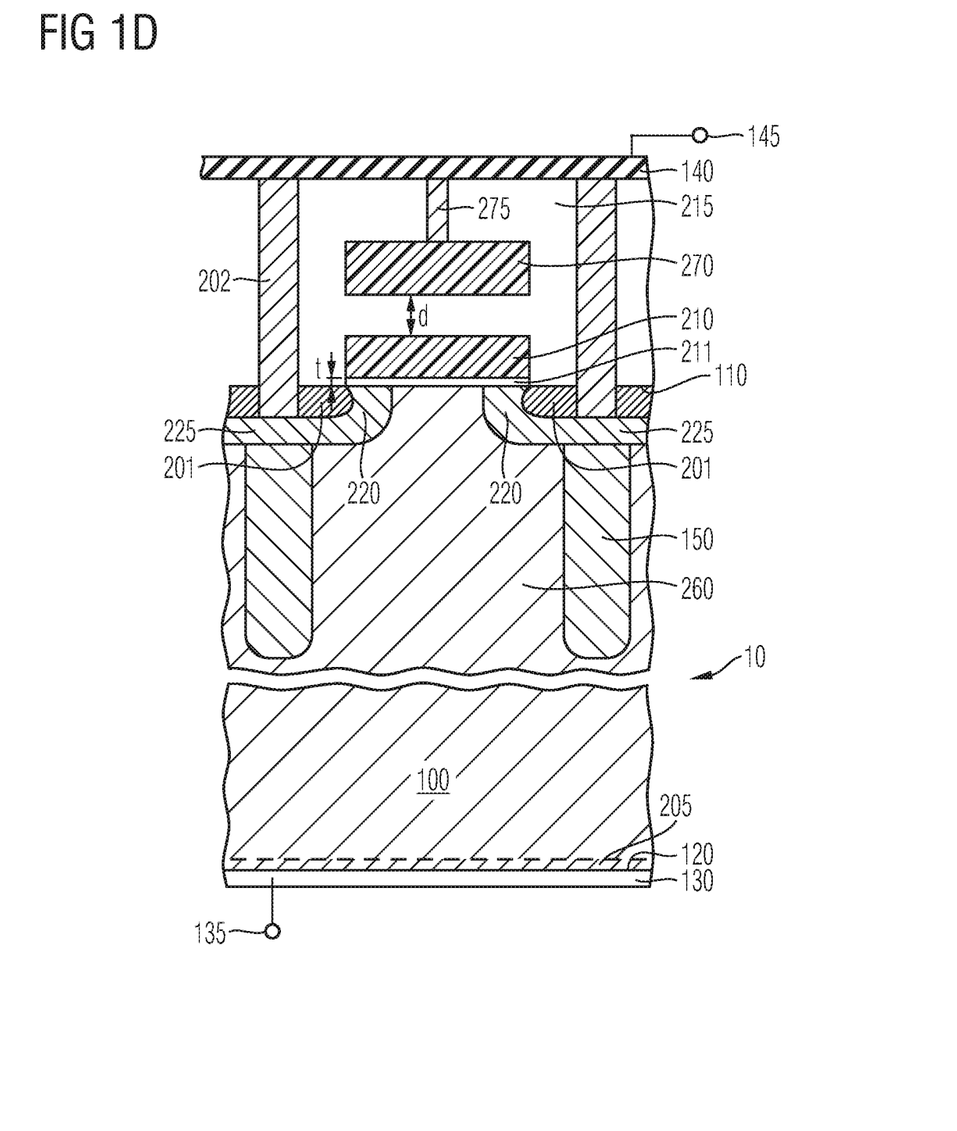
FIG. 1D shows a vertical cross-sectional view of the semiconductor device according to one or more further embodiments.

FIG. 1D shows a vertical cross-sectional view of still a further example. The semiconductor device 10 shown in FIG. 1D differs from the semiconductor device shown in FIG. 1A in that the semiconductor device 10 implements a so-called compensation power semiconductor device. In more detail, the semiconductor device 10 of FIG. 1D further comprises compensation portions 150 of the second conductivity type. To be more specific, a plurality of densely packed columns of the second conductivity type are disposed in the drift zone 260. When a blocking voltage is applied to the device, a depletion zone develops along the column structure and a compensation of charge carriers takes place. As a result, the dopant concentration of the drift zone 260 may be increased while maintaining the breakdown characteristics of the transistor. Hence, the on-resistance may be reduced while at the same time the breakdown characteristics are not deteriorated. The compensation structure shown in FIG. 1D may be applied to any of the examples described in this disclosure.

In compensation devices, problems of ringing may occur. Ringing effects refer to oscillations of gate and drain voltages which may be caused by parasitic effects. For example, these parasitic effects may be caused by inductive elements that may be due to current-conducting elements of the semiconductor device. With the miniaturization of power MOSFETs, the gate capacitance may be reduced so that these devices may be switched at a higher speed at lower switching losses. It has been observed that during these switching operations, high voltage peaks may occur. In particular, when a device is switched off, ringing effects involving high peak voltages may occur. Generally, ringing may be suppressed by increasing the resistance of the gate electrode so as to reduce a gate current. However, when the resistance of the gate electrode is increased, the switching efficiency may be reduced. Differently stated, when the resistance of the gate electrode is increased, the switching losses when switching on and switching off may be increased.

The semiconductor device according to examples, comprising the conductive plate 270 as shown in FIGS. 1A, 1B and 1D or the special structure of the source conductive layer 140 as shown in FIG. 1C may specifically avoid these ringing effects, in particular, in compensation power devices. Due to the presence of the conductive plate 270 these ringing effects may be suppressed.

Figure 2A:
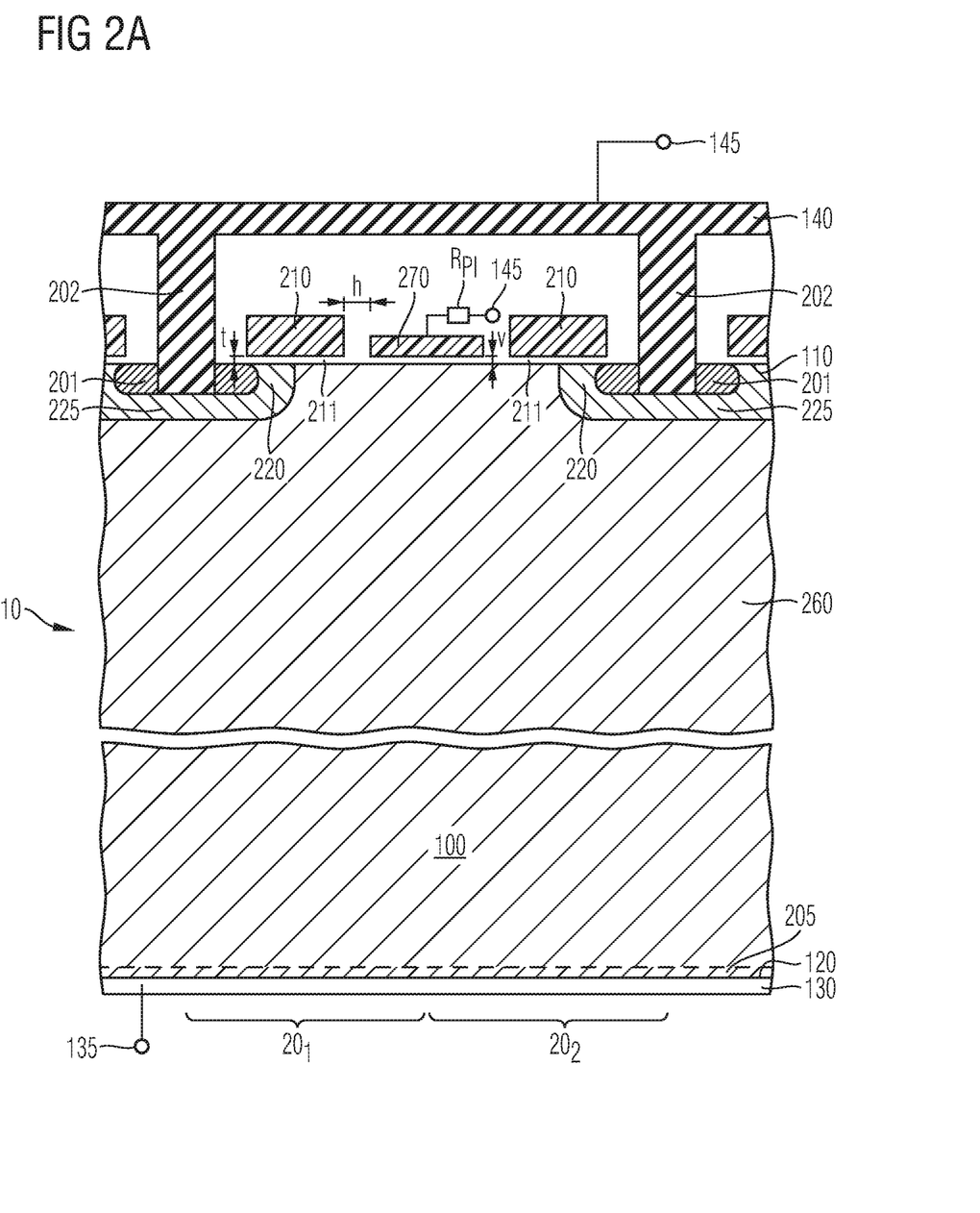
FIG. 2A shows a vertical cross-sectional view of a semiconductor device according to one or more embodiments.

FIG. 2A shows a vertical cross-sectional view of a semiconductor device according to a further example. The semiconductor device of FIG. 2A comprises similar elements as the semiconductor device shown in FIG. 1A. The gate electrode 210 is completely arranged over the semiconductor substrate. Differing from the semiconductor device shown in FIG. 1A, the conductive plate 270 is horizontally spaced apart from the gate electrode. The conductive plate 270 is electrically connected to the source terminal 145. The conductive plate 270 is completely arranged over the semiconductor substrate 100.

In the context of the present disclosure, the term "horizontally spaced apart" is intended to mean that at least a portion of the conductive plate 270 is spaced from the gate electrode 210 in a horizontal direction. To be more specific, a portion of the conductive plate 270 may be arranged on the right-hand or the left-hand side of a portion of the gate electrode 210. The term "horizontally spaced apart" leaves open whether the components overlap or do not overlap in a vertical direction. According to embodiments, the conductive plate 270 may overlap in a vertical direction with the gate electrode 210. According to further embodiments, the conductive plate 270 need not overlap in a vertical direction with the gate electrode 210. According to these embodiments, the conductive plate 270 may be spaced apart from the gate electrode 210 in both directions, the vertical and the horizontal direction, as will be explained below with reference to FIG. 2C.

An effective resistance $R_{P1}$ of the conductive plate 270 may be larger than the effective resistance $R_G$ of the gate electrode 210. The term "effective resistance" refers to the resistance of the conductive plate or the gate electrode with respect to the entire semiconductor device, taking into account the influence of a wiring connecting the conductive plate or the gate electrode with a corresponding terminal, e.g. the source or gate terminal. When determining the effective resistance $R_{P1}$ of the conductive plate 270, the number of transistor cells to which the conductive plate 270 is assigned, has to be taken into account. For example, as illustrated in FIG. 2A, the conductive plate 270 is assigned to two adjacent transistor cells.

For example, the effective resistance of the conductive plate may fulfill the following formulas:

$$2 \times R_G \leq R_{P1} \text{ and } R_{P1} \leq 10 \times R_G \quad (5)$$

When the effective resistance of the conductive plate lies within the range given above, the suppression of the ringing effects may be further improved. In particular, the oscillation of the gate or drain voltage may be damped.

Specific implementations of the conductive plate 270 so as to fulfill the above formulas will be discussed below with reference to FIG. 2E.

In the above formula, the factor "2" is due to the fact that two adjacent transistor cells share a common conductive plate 270, as is also indicated in FIG. 2A. In the case of two adjacent transistor cells also comprising a common gate electrode, the following formulas may be fulfilled:

$$R_G \leq R_{P1} \text{ and } R_{P1} \leq 5 \times R_G \quad (6)$$

According to the example shown in FIG. 2A, a distance h between the conductive plate and the gate electrode may be measured in a horizontal direction. The distance h and a thickness t of a gate dielectric layer may fulfill the following formulas:

$$t \leq h \leq 10 \times t, \quad (7)$$

or $$t \leq h \leq 5 \times t \quad (8)$$

If the distance h is larger than the upper value, the source-gate capacitance will be reduced resulting in an insufficient effect of the additional source-gate capacitance. If the distance h is below the lower boundary, a source-gate breakdown may occur at the thinnest portion of the insulating layer 215, which may result in a worse maximum gate-source voltage (Vgs,max) rating of the semiconductor device.

According to the example shown in FIG. 2A, a vertical distance v between the conductive plate and a first main surface of the semiconductor substrate and a thickness t of a gate dielectric layer may fulfill the following formula:

$$t \leq v \leq 10 \times t \quad (9)$$

According to the embodiments of FIG. 2A, two transistor cells $20_1$, $20_2$ are arranged adjacent to each other. Each of the transistor cells comprises a source region 201 which is electrically coupled to a source terminal 145 via a source contact. A gate electrode 210 is disposed over the first main surface 110 of the semiconductor substrate. A body region 220 and a portion of the drift zone 260 may be disposed at the first main surface 110 and may extend into the semiconductor substrate. The gate electrode 210 may control the conductivity of a channel formed in the body region 220. According to embodiments illustrated in FIG. 2A, the conductive plate 270 is arranged between the gate electrodes 210 of adjacent transistor cells $20_1$, $20_2$. The conductive plate is assigned to the two transistor cells $20_1$, $20_2$. Moreover, the conductive plate 270 is arranged at a position between the source regions 201 of adjacent transistor cells and between source contacts 202 of adjacent transistor cells.

The conductive plate 270 is arranged adjacent to the drift zone 260 at a portion of the drift zone which is horizontally in direct contact to the body region 220. In particular, the conductive plate 270 is arranged adjacent to the drift zone 260 near a region of the body region 220 in which the gate electrode 210 controls the conductivity of a conductive channel. Further, the conductive plate 270 is arranged adjacent to the drift zone 260 at the first main surface 110 of the semiconductor substrate 100.

Figure 2B:
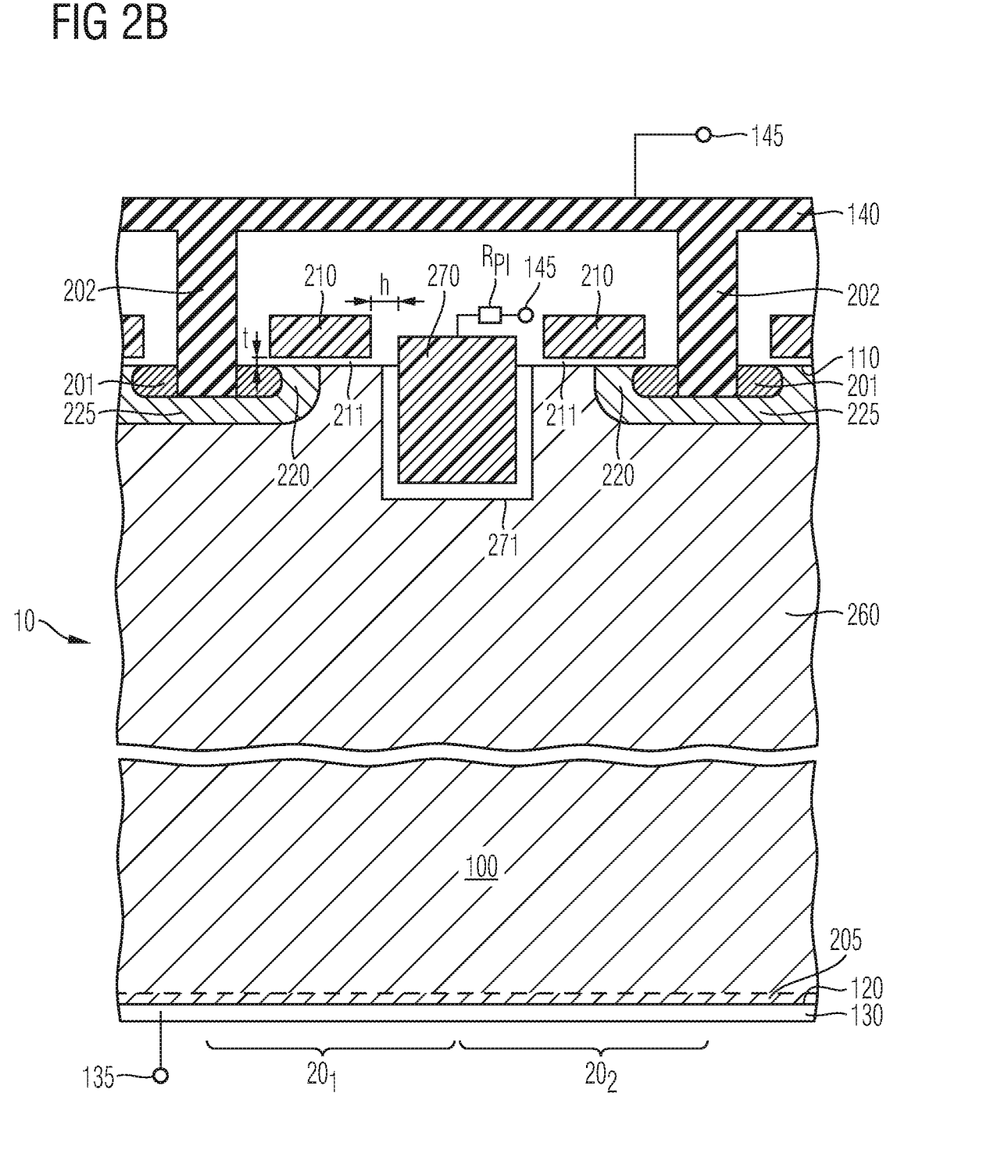
FIG. 2B shows a vertical cross-sectional view of a semiconductor device according to one or more further embodiments.

FIG. 2B shows a vertical cross-sectional view of a semiconductor device according to a further example. The semiconductor device 10 of FIG. 2B is similar to that of FIG. 2A. Differing from the semiconductor device of FIG. 2A, a portion of the conductive plate 270 is buried in the semiconductor substrate 100. For example, a portion of the conductive plate 270 may be arranged in a trench 271 formed in the first main surface 110 of the semiconductor substrate 100.

Figure 2C:
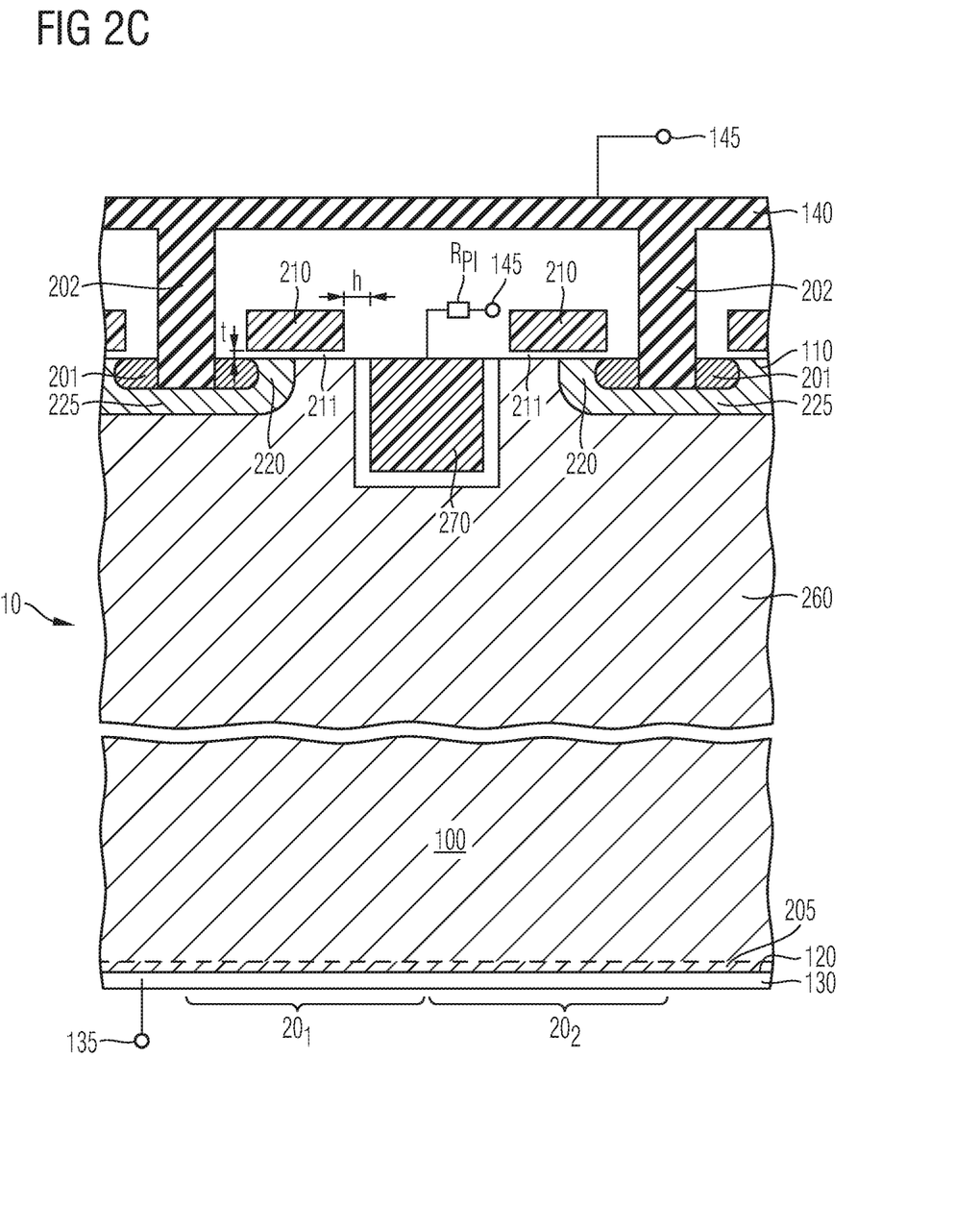
FIG. 2C shows a vertical cross-sectional view of a semiconductor device according to one or more further embodiments.

FIG. 2C shows a vertical cross-sectional view of a semiconductor device according to still a further example. The semiconductor device 10 of FIG. 2C is similar to that of FIG. 2B. Differing from the semiconductor device of FIG. 2B, the conductive plate 270 is completely buried in the semiconductor substrate 100. For example, a portion of the conductive plate 270 may be arranged in a trench 271 formed in the first main surface 110 of the semiconductor substrate 100. Further, an insulating material is formed over the conductive plate 270. According to this example, no portion of the conductive plate 270 extends over the first main surface 110 of the semiconductor substrate 100. As illustrated in FIG. 2C, the conductive plate 270 is horizontally spaced apart from the gate electrode by a distance h. There may be no horizontal or vertical overlap between the gate electrode 210 and the conductive plate 270. According to a different interpretation, the conductive plate 270 is vertically spaced apart from the gate electrode 210.

Figure 2D:
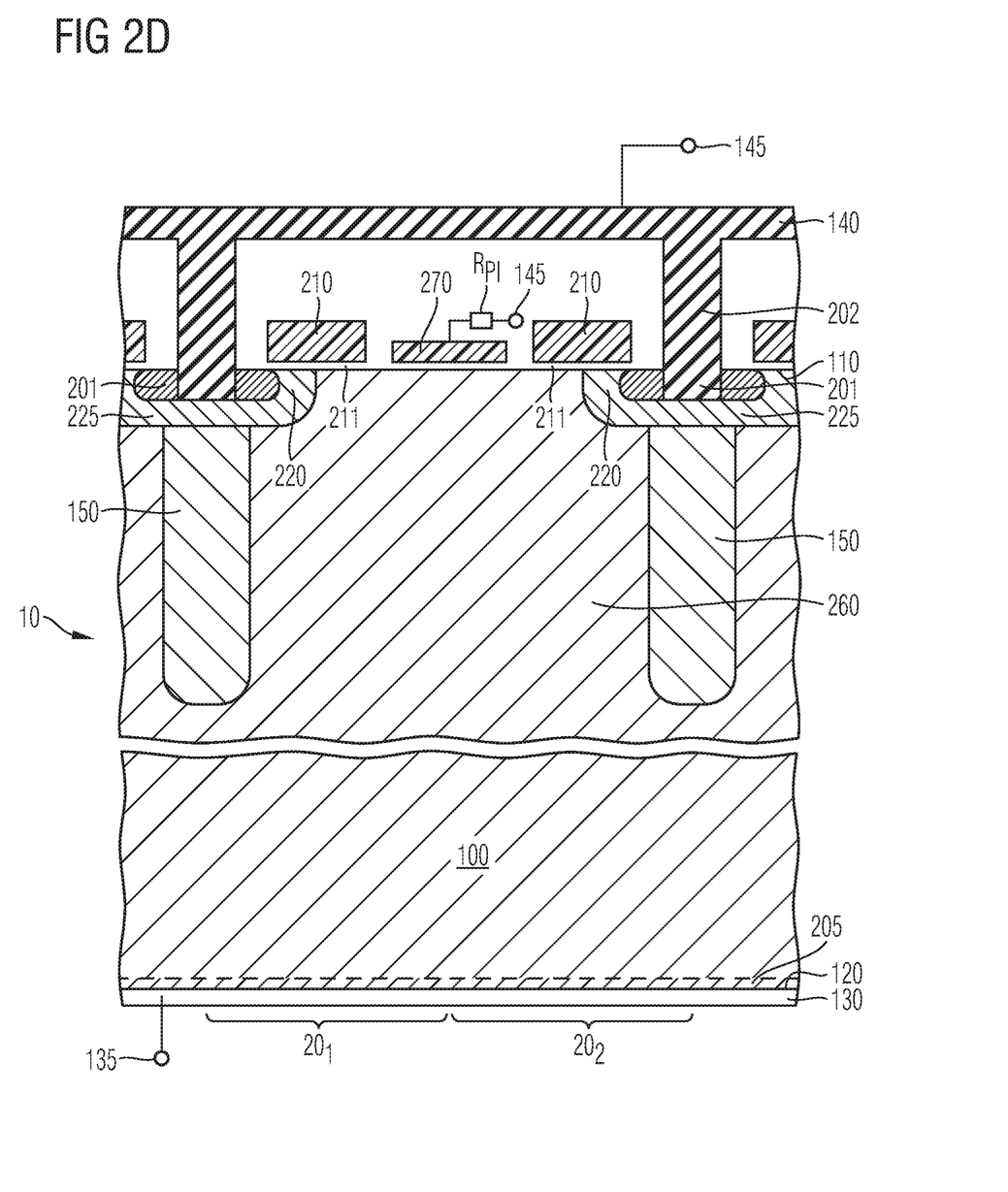
FIG. 2D shows a vertical cross-sectional view of a semiconductor device according to one or more further embodiments.

FIG. 2D shows a vertical cross-sectional view of a semiconductor device according to a further example. The semiconductor device 10 of FIG. 2D essentially corresponds to that of FIG. 2A. Differing from the semiconductor device of FIG. 2A, the semiconductor device 10 of FIG. 2D comprises columns 150 of the second conductivity type which are embedded in the drift zone 260 of the first conductivity type. Accordingly, the semiconductor device of FIG. 2D implements a compensation semiconductor device which has been discussed above with reference to FIG. 1D. The compensation structure illustrated in FIG. 2D may be applied to any of the semiconductor devices described in this disclosure.

Figure 2E:
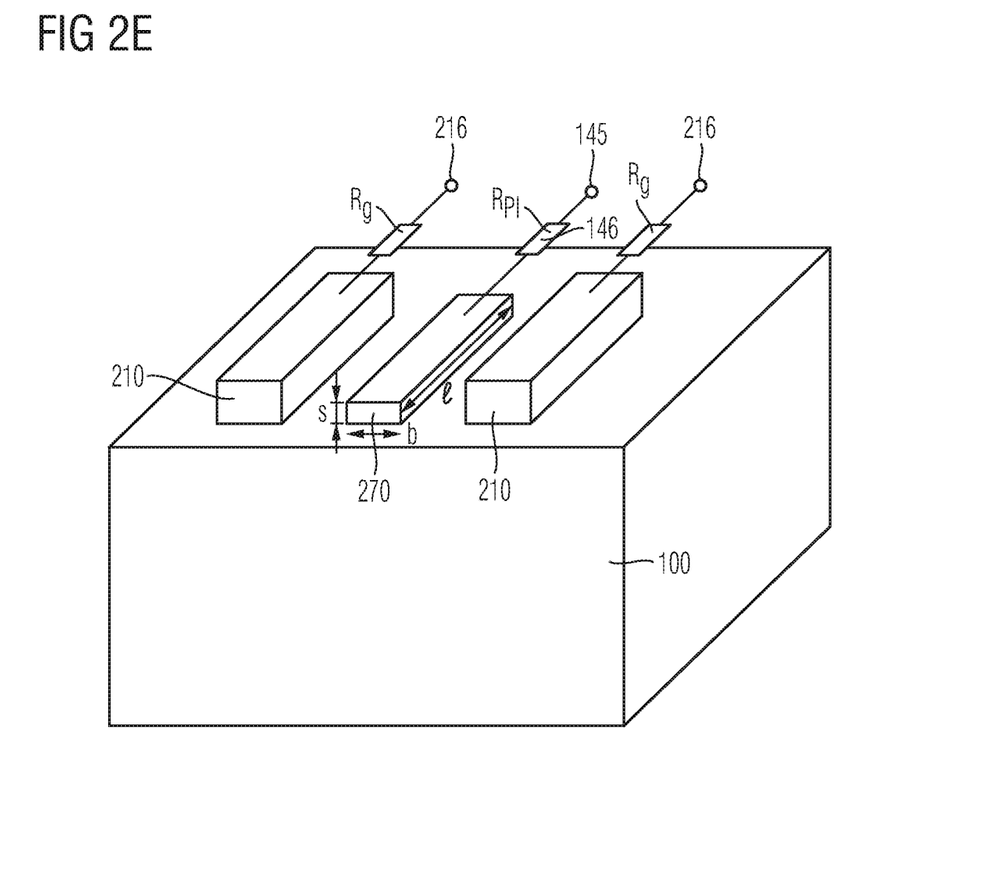
FIG. 2E shows a schematic view of components of the semiconductor device according to one or more further embodiments.

FIG. 2E shows a schematic perspective view of a portion of the semiconductor device. The portion of the semiconductor device comprises components of two adjacent transistor cells. The two adjacent transistor cells may share one common conductive plate 270. The portion of the semiconductor device comprises a gate electrode 210 and a conductive plate 270 assigned to the two transistor cells. The conductive plate 270 is electrically coupled to the source terminal 145. The gate electrodes 210 are electrically coupled to the gate terminal 216.

As has been explained above, the effective resistance of the gate electrode 210 is smaller than the effective resistance of the conductive plate. For example, the conductive plate 270 may be implemented of the same material as the gate electrode 210, e.g. polysilicon. For example, the geometry of the conductive plate 270 may be different from a geometry of the gate electrode 210. In more detail, the volume of the conductive plate 270, e.g. the product of (b×l×s) may be smaller than (2×the volume of the gate electrode 210). Again, the factor "2" is due to the fact that two adjacent transistor cells share the common conductive plate 270.

According to a further modification, the conductive plate 270 and the gate electrode 210 may be made of different materials.

According to further embodiments, the conductive plate may be electrically connected via a separate resistor element 146 to the source terminal 145. The separate resistor element 146 has a resistance so as to provide a desired effective resistance of the conductive plate 270.

According to further examples, elements of the examples illustrated in FIGS. 1 and 2 may be combined. For example, the conductive plate 270 may be implemented so that a part of the conductive plate 270 is arranged over the gate electrode 210. Moreover, another part of the conductive plate 270 may be disposed horizontally adjacent to or horizontally spaced apart from the gate electrode over the semiconductor substrate 100.

Figure 3:
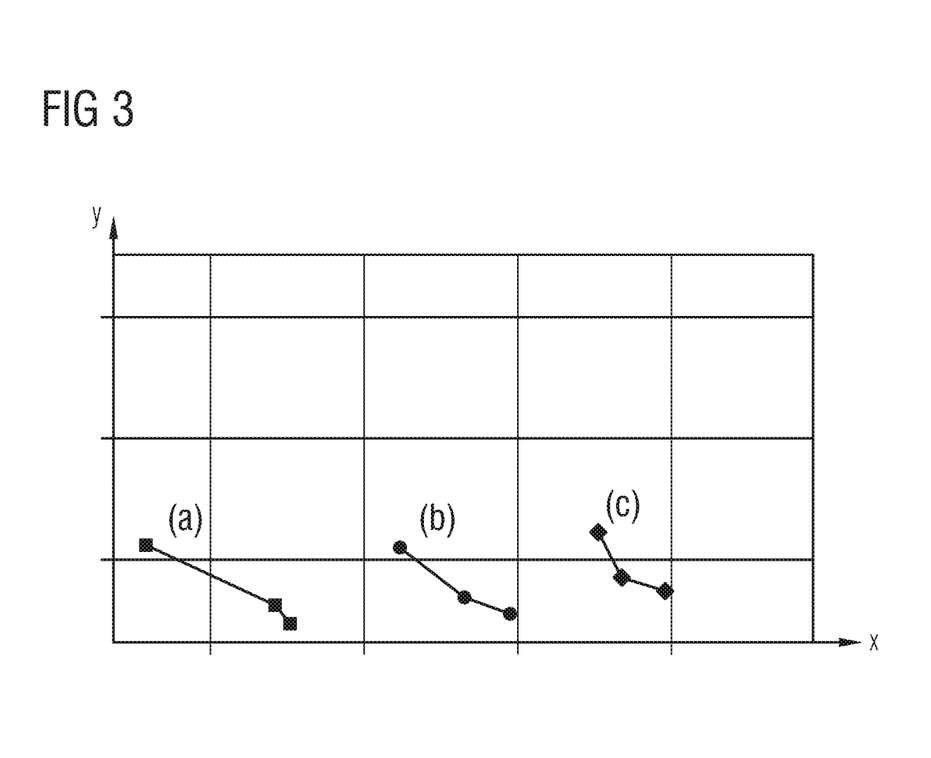
FIG. 3 shows a result of a simulation illustrating characteristics of the semiconductor device.

FIG. 3 shows a comparison of the characteristics of a transistor comprising the conductive plate which is disposed over the gate electrode (graph (a)) and of a device comprising a conductive plate which is arranged horizontally spaced apart from the gate electrode (graph (b)). Graph (c) shows a semiconductor device without a conductive plate. The x axis indicates ringing effects and represents a maximum oscillation of the drain or gate voltage. The y axis denotes the switching efficiency of the semiconductor device. The measurement values are taken for different values of the resistance of the gate electrode material. As was indicated above, when using a gate electrode material having a higher resistivity, the switching efficiency is increased (and thus the switching losses are increased). On the other side, the higher the switching losses, the lower the ringing effects. As can be taken from a comparison of the different characteristics for the different devices, by employing the conductive plate, the ringing effects may be suppressed and at the same time, the switching losses may be reduced.

According to a more general concept, the semiconductor device comprises a vertical MOSFET comprising a planar gate electrode comprising an additional source-gate capacitance. This additional source-gate capacitance may, e.g. be implemented by a conductive plate that is electrically connected to a source terminal. Due to the presence of this gate-source capacitance ringing effects of the transistor may be suppressed.

Figure 4:
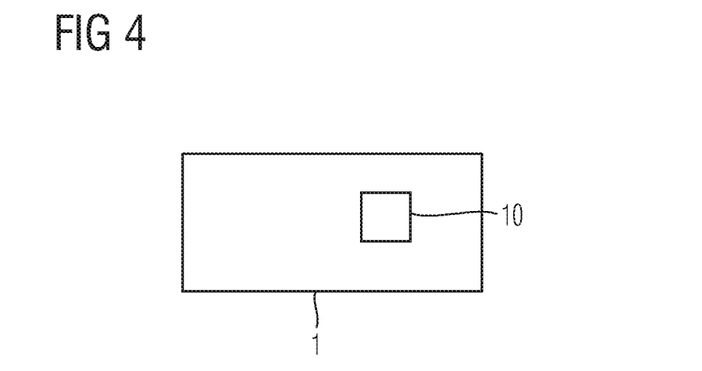
FIG. 4 shows a schematic view of an electric device according to one or more embodiments.

FIG. 4 schematically illustrates an electric device 1 comprising the semiconductor device 10 which has been explained above. For example, the electric device may be a switched mode power supply (SMPS), a switched mode power supply comprising power factor correction, a fly back converter and any kind of electric device comprising a switched mode power supply.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A semiconductor device, comprising:
a transistor comprising:
    a source region adjacent to a first main surface of a semiconductor substrate, the source region being electrically coupled to a source terminal via a source contact;
    a gate electrode over the first main surface of the semiconductor substrate;
    a drain region adjacent to a second main surface of the semiconductor substrate opposite the first main surface;
    a conductive plate vertically adjacent to the gate electrode, the conductive plate being in electrical contact with the source terminal; and
    an insulating material arranged between the conductive plate and the source contact in a direction parallel to the first main surface.

2. The semiconductor device of claim 1, wherein the entire conductive plate is disposed over the gate electrode.

3. The semiconductor device of claim 2, further comprising a gate dielectric layer having a thickness t between the gate electrode and the semiconductor substrate and a distance d between the conductive plate, and wherein d≤10×t.

4. The semiconductor device of claim 3, wherein d≤5×t.

5. The semiconductor device of claim 1, wherein the conductive plate is disposed below the gate electrode.

6. The semiconductor device of claim 1, wherein the conductive plate is disposed in a trench in the semiconductor substrate.

7. The semiconductor device of claim 1, further comprising a source conductive layer disposed above the gate electrode and electrically coupled to the source terminal, wherein the source region is electrically connected via the source contact to the source conductive layer.

8. The semiconductor device of claim 7, wherein the conductive plate is vertically interposed between the gate electrode and the source conductive layer.

9. The semiconductor device of claim 8, wherein the conductive plate is electrically connected to the source conductive layer via a contact portion which vertically extends from the conductive plate to the source conductive layer.

10. The semiconductor device of claim 7, wherein the conductive plate is formed integrally with the source conductive layer.

11. The semiconductor device of claim 10, wherein the source conductive layer is arranged so that a distance d between the gate electrode and the source conductive layer and a thickness t of a gate dielectric layer which separates the gate electrode from the first main surface of the semiconductor substrate fulfil:

$t \leq d$, and $d \leq 10 \times t$ or $d \leq 5 \times t$.

12. The semiconductor device of claim 7, wherein a material of the conductive plate is different from a material of the source conductive layer.

* * * * *